United States Patent
Drake et al.

(10) Patent No.: US 6,281,574 B1
(45) Date of Patent: Aug. 28, 2001

(54) HIGH POWER MICROWAVE TRANSISTOR AMPLIFIER

(75) Inventors: Peter R. Drake, Hudson; Keith R. Kessler, Andover, both of MA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/405,931

(22) Filed: Sep. 27, 1999

(51) Int. Cl.$^7$ .............................. H01L 23/10; H01L 23/34
(52) U.S. Cl. ................ 257/706; 257/728; 257/729; 257/707
(58) Field of Search ................... 257/706, 707, 257/703, 712, 728, 729

(56) References Cited

U.S. PATENT DOCUMENTS

| 4,360,965 | * | 11/1982 | Fujiwawa . |
| 4,425,195 | * | 1/1984 | Papanicolaou . |
| 5,886,407 | * | 3/1999 | Polese et al. . |
| 6,081,028 | * | 6/2000 | Ettehadich et al. . |

FOREIGN PATENT DOCUMENTS

| 0 932 199 A2 | * | 10/1981 | (EP) . |
| 56-125849 | * | 10/1981 | (JP) . |
| 60-127750 | * | 10/1981 | (JP) . |

* cited by examiner

Primary Examiner—Sheila V. Clark
(74) Attorney, Agent, or Firm—Daly, Crowley & Mofford, LLP

(57) ABSTRACT

A method for operating a microwave amplifier wherein a packaging arrangement is provided. The packaging arrangement includes: (i) a mounting thermally conducting mounting flange; (ii) an isomorphic, thermally conductive material disposed on the flange; (iii) a circuit comprising a semiconductor chip having a transistor arranged as the amplifier, such amplifier being adapted to operate at a nominal microwave frequency with a band of frequencies, disposed on a portion of a surface of the isomorphic, thermally conductive material, other surface portions of the thermally conductive material extending laterally beyond the portion of the material having the semiconductor chip disposed thereon; (iv) a corral having an aperture through an inner region thereof, the isothermal material being disposed within the aperture, such corral having an outer region thereon mounted to surface portions of the flange. The amplifier is biased for Class C operation. The method includes feeding pulsed microwave signals to the amplifier for amplification thereby. The pulses have pulse widths greater than 750 microseconds and have a duty cycle of about 25 percent or more. Thus, the amplifier is now able to operate with a substantially continuous wave input signal.

6 Claims, 5 Drawing Sheets

Table 1: Junction Temperature vs. Dissipated Power

Conditions: 3.3GHz, 25% Duty Cycle VCC=32VDC, 100us pulse
Tuning on input and output for max output power.

Standard Device S/N 7

| Pin (W-pk) | Pout (W-pk) | Ic (A-pk) | IR Scan. Voltage (ave-mv) | T-Ave. Deg-C | Pdiss. (Watts) | Collector Efficiency (%) | Tflange Deg. C | Thermal Resist. J-C |
|---|---|---|---|---|---|---|---|---|
| 7.90 | 47.5 | 4.22 | 73 | 92.0 | 95.4 | 35.2 | 42.3 | 0.52 |
| 8.90 | 63.1 | 4.66 | 101 | 103.0 | 94.9 | 42.3 | 43.6 | 0.63 |
| 10.00 | 69.2 | 5.07 | 143 | 118.0 | 103.0 | 42.7 | 45.0 | 0.71 |
| 11.22 | 76.6 | 5.63 | 259 | 149.0 | 114.8 | 42.5 | 47.0 | 0.89 |

Diamond Device

| Pin (W-pk) | Pout (W-pk) | Ic (A-pk) | IR Scan. Voltage (ave-mv) | T-Ave. Deg-C | Pdiss. (Watts) | Collector Efficiency (%) | Tflange Deg. C | Thermal Resist. J-C |
|---|---|---|---|---|---|---|---|---|
| 7.9 | 41.7 | 3.55 | 58 | 79.0 | 79.8 | 36.7 | 39.0 | 0.50 |
| 8.9 | 46.8 | 3.92 | 76 | 93.0 | 87.5 | 37.3 | 40.1 | 0.60 |
| 9.8 | 50.8 | 4.18 | | | 92.7 | 38.0 | | |
| 10.0 | 52.3 | 4.28 | 98 | 102.0 | 94.7 | 38.2 | 41.4 | 0.64 |
| 10.7 | 55.5 | 4.53 | | | 100.2 | 38.3 | | |
| 11.2 | 57.5 | 4.69 | 123 | 111.0 | 103.8 | 38.3 | 42.9 | 0.66 |
| 12.6 | 61.7 | 5.13 | 170 | 127.1 | 115.1 | 37.6 | 44.6 | 0.72 |

FIG. 4A

Table 2: Junction Temperature vs. Pulse Width, Dissipated Power=100W

Standard Device

3.3GHz, Pin=9.77 W, VCC=32VDC, Ic=4.89 A, 25% Duty Cycle, Pout=66.2 W
Pdiss=100.1W, Tuning on input and output for maximum Output Power

| Pulse Width (us) | Tf Deg. (C) | IR Scanner Output | | | | Ave. Volt. (mv) | Ave. Temp (Deg. C) | Tjc | Thermal Resist. J-C |
| --- | --- | --- | --- | --- | --- | --- | --- | --- | --- |
| | | Cell 1 (mv) | Cell 2 (mv) | Cell 3 (mv) | Cell 4 (mv) | | | | |
| 100 | 44.4 | 140 | 90 | 145 | 140 | 129 | 114 | 70 | 0.74 |
| 200 | 44.0 | 240 | 140 | 250 | 245 | 219 | 141 | 97 | 1.04 |
| 300 | 44.0 | 350 | 220 | 310 | 360 | 310 | 158 | 114 | 1.21 |
| 400 | 44.5 | 500 | 280 | 500 | 460 | 435 | 178 | 134 | 1.42 |

Diamond Heat Sink Device

3.3GHz, Pin=10.7 W, VCC=32VDC, Ic=4.53 A, 25% Duty Cycle, Pout=55.5 W
Pdiss=100.2W, Tuning on input and output for max. Pout.

| Pulse Width (us) | Tf Deg. (C) | IR Scanner Output | | | | Ave. Volt. (mv) | Ave. Temp (Deg. C) | Tjc | Thermal Resist. J-C |
| --- | --- | --- | --- | --- | --- | --- | --- | --- | --- |
| | | Cell 1 (mv) | Cell 2 (mv) | Cell 3 (mv) | Cell 4 (mv) | | | | |
| 100 | 41.7 | 160 | 90 | 65 | 95 | 103 | 103 | 61 | 0.65 |
| 200 | 42.3 | 250 | 150 | 100 | 155 | 164 | 126 | 84 | 0.89 |
| 300 | 42.4 | 320 | 170 | 110 | 190 | 198 | 133 | 91 | 0.96 |
| 400 | 42.6 | 360 | 190 | 125 | 210 | 221 | 140 | 97 | 1.04 |
| 500 | 41.5 | 380 | 190 | 130 | 220 | 230 | 144 | 103 | 1.09 |
| 1000 | 43.1 | 440 | 230 | 155 | 250 | 269 | 153 | 110 | 1.17 |
| 2000 | 43.6 | 480 | 270 | 170 | 280 | 300 | 159 | 115 | 1.23 |
| 3000 | 43.6 | 510 | 285 | 185 | 285 | 316 | 162 | 118 | 1.26 |

*FIG. 4B*

HIGH POWER MICROWAVE TRANSISTOR AMPLIFIER

BACKGROUND OF THE INVENTION

This invention relates generally to high power transistor amplifiers and more particularly to packaging arrangements for removing heat from transistors used in such amplifiers.

As is known in the art, high power microwave amplifiers have a wide range of applications. Many applications, such as Continuous Wave (CW), (i.e., high duty cycle), Class C operation, require that, for practical use such amplifiers must operate with high power, high efficiency and be of low cost. These applications require a technique for efficiently removing heat from the transistor. One technique used to remove such heat is by the packaging arrangement shown in FIGS. 1A and 1B. As shown therein, a semiconductor chip 10, having a bipolar transistor configured in a common base configuration, is shown. The semiconductor chip 10 is disposed on a thermally conductive, electrically insulating, beryllium oxide (BeO), heat sink 12. The heat sink 12 is mounted to a thermally conductive mounting flange 14. A dielectric corral 16, here a ceramic such as alumina, has an aperture 18 in an inner region thereof. The chip 10 with the heat sink 12 is disposed in the aperture 18 so the outer portion of the coral 16 encloses or encases, the sidewalls of the beryllium oxide heat sink 12. The corral 16 has electrical conductors 21 passing therethrough to enable connection of input signals, and bias voltages to the amplifier of chip 10 and to enable the amplified signal to be coupled out of the packaging arrangement. More particularly, the amplifier of the chip 10 is electrically connected to the conductors 21 by wires 22 (FIG. 1B). A cover 24, for example Kovar or Alloy 42 material, is used to shield the amplifier of chip 19. The width of the aperture 18 is typically less than $\lambda/4$ where $\lambda$ is the wavelength of the nominal microwave operating frequency of the amplifier.

Another packaging arrangement is shown in FIG. 2. Here, a diamond insert 26 is placed in the central region of the beryllium oxide heat sink 12. The semiconductor chip 12 is mounted to the upper surface of the diamond insert 26 and the lower surface of the diamond insert 26 is mounted on the mounting flange 14. Thus, the diamond insert 26 is enclosed, or encased around the sidewalls thereof by the beryllium oxide corral 16. Testing such an arrangement showed a temperature reduction of less than 3 degrees Centigrade when operating under the same conditions as the packing arrangement shown in FIGS. 1A and 1B.

In spite of this improvement, such device has not been found adequate for Class C operation with high duty cycle, (i.e., substantially CW) operation, at high power levels. Further, beryllium oxide is a highly toxic, and therefore undesirable, material.

SUMMARY OF THE INVENTION

In accordance with the present invention, a transistor structure is provided. The structure includes a mounting thermally conducting mounting flange. An isomorphic, thermally conductive material is disposed on the flange. A semiconductor chip is disposed on a portion of a surface of the isomorphic, thermally conductive material, other surface portions of the thermally conductive material extending laterally beyond the portion of the material having the semiconductor chip disposed thereon.

With such an arrangement, the isomorphic material is able to spread heat generated in the semiconductor chip laterally beyond the region thereon directly below the semiconductor chip and thereby increase the heat removal efficiency of the arrangement.

In accordance with another feature of the invention, wherein the isomorphic material is an isothermal conductive material.

In accordance with another feature of the invention wherein the isomorphic material is diamond or silicon carbide.

In accordance with another feature of the invention, a transistor structure is provided. The structure includes a mounting thermally conducting mounting flange. Diamond is disposed on the flange. A semiconductor chip is disposed on a portion of a surface of the diamond, other surface portions of the diamond extending laterally beyond the portion of the diamond.

In accordance with another feature of the invention, the packaging arrangement is provided. The arrangement includes a mounting thermally conducting mounting flange. An isomorphic, thermally conductive material is disposed on the flange. A circuit, comprising a semiconductor chip having a transistor arranged as an amplifier and adapted to operate at a nominal microwave frequency with a band of frequencies is disposed on a portion of a surface of the isomorphic, thermally conductive material. Other surface portions of the thermally conductive material extend laterally beyond the portion of the material having the semiconductor chip disposed thereon. A corral having an aperture through an inner region thereof, the isothermal material being disposed within the aperture. An outer region of the corral is mounted to surface portions of the flange.

In accordance with another feature of the invention, wherein the aperture has a length less than $\lambda/4$, where $\lambda$ is the wavelength of the nominal operating microwave frequency of the amplifier.

In accordance with another feature of the invention, the circuit is configured to bias the amplifier for Class C operation. Further, the amplifier is configured to amplify pulsed microwave signals with for example, pulse widths greater than 750 microseconds and duty cycles of about 25 percent or more. Thus, the amplifier is now able to operate with a continuous wave input signal.

In accordance with yet another feature of the invention, a method is provided for operating a microwave amplifier. The method includes providing a packaging arrangement having: (i) a mounting thermally conducting mounting flange; (ii) an isomorphic, thermally conductive material disposed on the flange; (iii) a circuit comprising a semiconductor chip having a transistor arranged as the amplifier, such amplifier being adapted to operate at a nominal microwave frequency with a band of frequencies, disposed on a portion of a surface of the isomorphic, thermally conductive material, other surface portions of the thermally conductive material extending laterally beyond the portion of the material having the semiconductor chip disposed thereon; (iv) a corral having an aperture through an inner region thereof, the isothermal material being disposed within the aperture, such corral having an outer region thereon mounted to surface portions of the flange. The amplifier is biased for Class C operation.

In one embodiment, the method includes feeding pulsed microwave signals to the amplifier for amplification thereby.

In one embodiment, the pulses have pulse widths greater than 750 microseconds and have a duty cycle of about 25 percent or more. Thus, the amplifier is now able to operate with a continuous wave input signal.

BRIEF DESCRIPTION OF THE DRAWING

These and other features of the invention will become more readily apparent from the following detailed description when read together with the accompanying drawings, in which:

FIGS. 4A and 4B Tables of the junction temperature of a packaged transistor under various conditions.

DESCRIPTION OF THE PREFERRED EMBODIMENTS

Figure 2:
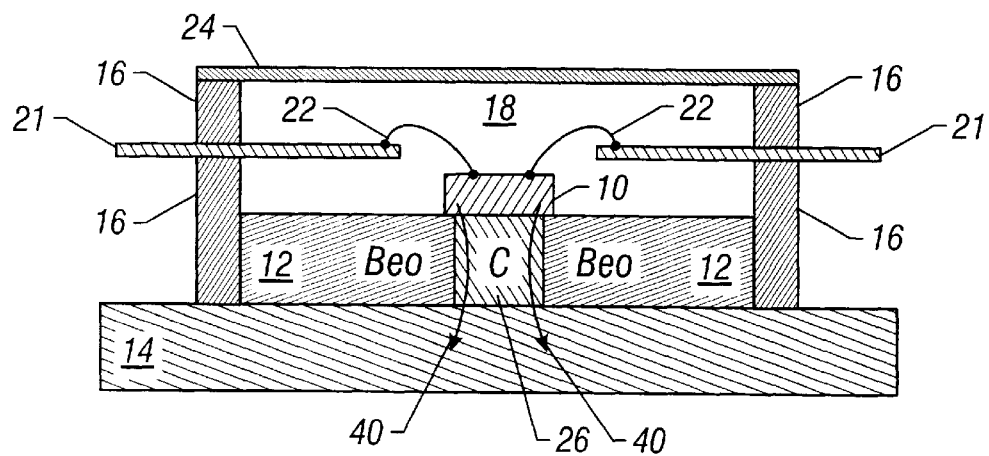
FIG. 2 is a cross-sectional sketch of an alternative packaging arrangement according to the PRIOR ART.
Figure 3:
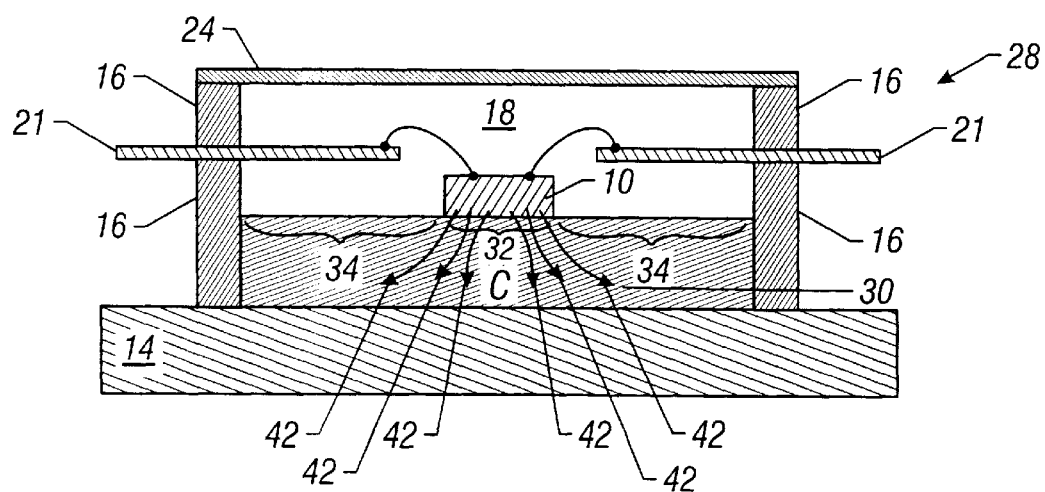
FIG. 3 is a cross-sectional sketch of an alternative packaging arrangement according to the invention

Referring now to FIG. 3, a transistor structure 28 is shown. The structure 28 includes a mounting thermally conducting mounting flange 14 as in FIGS. 1A, 1B and 2. An isomorphic, thermally conductive material 30 is disposed on the flange 14. Here, the isomorphic material 30 is an isothermal conductive material, for example diamond or silicon carbide. A semiconductor chip 10 is disposed on a portion 32 of a surface of the isomorphic, thermally conductive material 30. A cover 24, here a ceramic cover, is provided, as indicated. As in FIGS. 1A, 1B and 2, the chip 10 has an amplifier therein. Other surface portions 34 of the thermally conductive material 30 extend laterally beyond the portion 32 of the material 30 having the semiconductor chip 10 disposed thereon.

The chip 10 has, as noted above, a bipolar transistor arranged in a common base configuration. The average of the peak junction temperature of the transistor cell in chip 10 as a function of pulse width for a 25% duty cycle 100 watt power dissipation, Vcc supply voltage of 32 volts dc in Class C operation for such an arrangement is shown as curve 40 in FIG. 4. Also shown in FIG. 4 as curve 42 is the average of the peak junction temperatures of several transistor cells in chip 10 as a function of pulse width for a 25% duty cycle 100 watt power dissipation, Vcc supply voltage of 32 volts dc in Class C operation for such an arrangement shown in FIGS. 1A and 1B. More details of the conditions are shown in TABLE I and II in FIGS. 4A (for short pulse, here about 100 microseconds in duration) and 4B (for long pulses, here 3000 microseconds in duration), respectively.

Figure 1A:
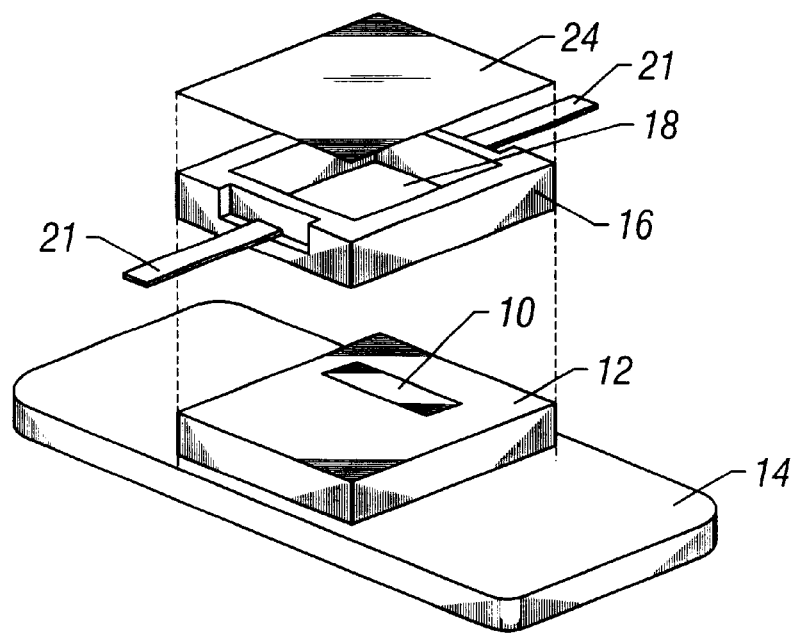
FIGS. 1A is an exploded isometric sketch of a packaging arrangement for a high power microwave amplifier according to the PRIOR ART.
Figure 1B:
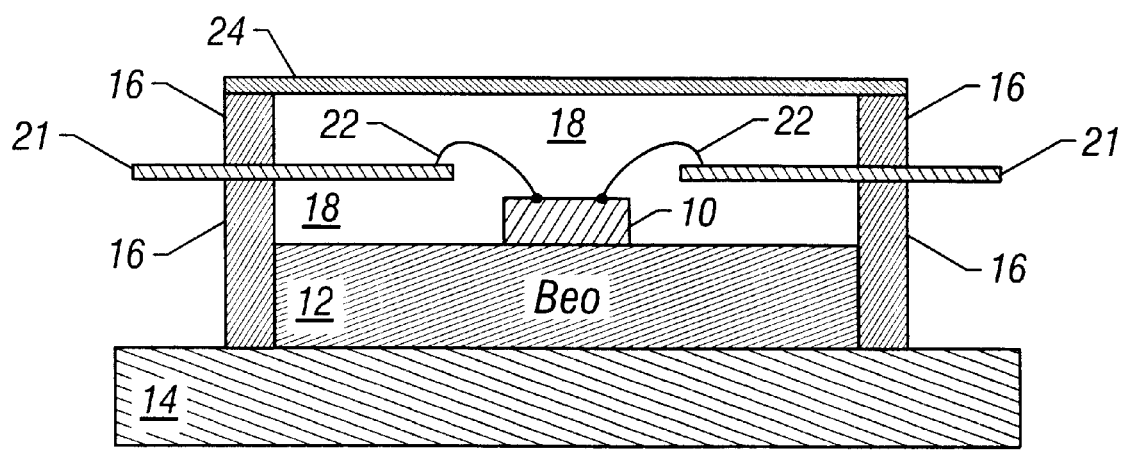
FIG. 1B is a cross-sectional sketch of the packaging arrangement of FIG. 1A according to the PRIOR ART.

More particularly, the semiconductor chip 10 of the arrangement 28 in FIG. 3 includes a circuit having a bipolar transistor comprising arranged as an common base amplifier adapted to operate in Class C at a nominal microwave frequency with a band of frequencies. The isomorphic material 30 is here diamond having a thickness of 12 mils. The diamond provides a heat sink; more particularly, a path for thermal conduction away from the semiconductor chip while providing electrical isolation. The diamond has a thermal conductivity of 1600–2000 Watts/meter–° K. The corral 16, like the corral in FIGS. 1A, 1B and 2 is alumina. Here the alumina corral 16 is brazed to the diamond heat sink 30. The aperture 18 in the corral 16 has a length less than $\lambda/4$, where $\lambda$ is the wavelength of the nominal operating microwave frequency of the amplifier. The semiconductor chip 13, as noted above, has a circuit which includes a bipolar transistor arranged as an amplifier and configured to bias the amplifier for Class C operation. The amplifier is configured to amplify pulsed microwave signals. Here, the pulses have pulse widths greater than 750 microseconds and have a duty cycle of about 25 percent or more. Thus, the amplifier is now able to operate with a continuous wave input signal.

The packaging arrangement shown in FIG. 3, packaged in a standard Kyocera, Japan, FO-57C or FO-57D type transistor package except for the diamond heat sink. Both devices were thermally scanned, in the infrared (IR) over a range of dissipated operating powers and over a range of pulse widths. Performance was measured with optimum tuning on input and output for maximum output power and the same test fixture was used for both devices. A Barnes IR scanner was used for the thermal scanning. Both devices were measured under the following conditions:

| | |
|---|---|
| Pulse Width | 100 microseconds |
| Duty Cycle | 25% |
| Collector voltage (Vcc) | 32 Volts DC. |

The flange temperature was 40–45° C. Junction temperature was measured for the range of device dissipated power and this was changed by changing the input power. The peak dissipated power is:

$$P\text{diss}=P in+(Vcc \times I_c)-\text{Pout};$$

where:

Pin is input power (watts);

Vcc is DC collector voltage;

$I_c$ is collector current; and

Pout is output power (watts).

The peak dissipated power was varied by changing the input power in half dB steps and re-tuning the RF tuners on both the input and output. This data is summarized in TABLE I in FIG. 4A.

As shown in FIG. 4A, the conditions were: 3.3 GHz operating frequency; 25% duty cycle; Vcc=32 Volts DC; 100 microsecond pulse width. Further: Pin is input power in Watts, peak; Pout is output power in watts-peak; IR Scan voltage is thermal noise in average millivolts; TAve is average peak temperature in degrees Centigrade for the transistor cells; Pdiss. is dissipated power as noted above in watts; Collector efficiency=$[P_{out}/(Vcc \times I_c)]$ in percent; Tflange is the temperature of the flange 14 in degrees Centigrade; and Thermal Resistance=[Tave-Tflange]/Pdiss in degrees Centigrade per Watt.

The Table in FIG. 4B is for a four transistor cell structure with the operating conditions being set forth therein as a function of pulse width.

A "long pulse" (i.e., substantially CW) test was made. In this set of test measurements, input powers were set for each device so that 100 Watts peak was dissipated. The duty cycle was kept constant while the pulse width was increased and peak junction temperatures were recorded. The results are shown in TABLE II (FIG. 4B).

It is observed that the device with the diamond heat sink, i.e., the arrangement 28 shown and described in connection with FIG. 3, was capable of much longer pulse widths than the arrangement shown and described above in connection with FIGS. 1 and 1B for a given junction temperature. Thus, the data shows that a bipolar transistor utilizing a diamond heat sink in the arrangement shown and described above in connection with FIG. 3 is capable of much longer pulse widths as compared with the arrangement described in connection with FIGS. 1A and 1B. At dissipated powers above 100 watts, it is also observed that the diamond heat sink arrangement of FIG. 3 has better thermal resistance than the arrangement of FIG. 2 for short pulse operation.

As understood, it is believed that this improved heat dissipation in arrangement 28 of FIG. 3 compared with the diamond insert 26 in FIG. 2 results from the fact that the heat from the chip 10 in FIG. 2 passes substantially vertically to the flange 14 as indicted by the arrows 40 in FIG. 2 while with the arrangement 28 in FIG. 3, the heat from the chip 10 is able to spread out laterally, as well as vertically as indicted by the arrows 42 in FIG. 3.

Other embodiments are within the spirit and scope of the appended claims.

What is claimed is:

1. A packaging arrangement, comprising:

mounting thermally conducting mounting flange;

an isomorphic, thermally conductive material disposed on the flange;

a circuit comprising a semiconductor chip having a transistor arranged as an amplifier adapted to operate at a normal microwave frequency with a band of frequencies, disposed on a portion of a surface of the isomorphic, thermally conductive material, other surface portions of the thermally conductive material extending laterally beyond the portion of the material having the semiconductor chip disposed thereon; and a corral having an aperture through an inner region thereof, the isothermal material being disposed within the aperture, such corral having an outer region thereon mounted to surface portions of the flange;

wherein the aperture has a length less than $\lambda/4$, where $\lambda$ is the wavelength of the nominal operating microwave frequency of the amplifier;

wherein the circuit is configured to bias the amplifier for Class C operation; and wherein the amplifier is configured to amplify pulsed microwave signals.

2. The packaging arrangement recited in claim 1 wherein the pulses have pulse widths greater than 750 microseconds.

3. The packaging arrangement recited in claim 2 wherein the pulses have a duty cycle of about 25 percent or more.

4. A method of operating a microwave amplifier, comprising:

(A) providing a packaging arrangement, comprising;

(i) a mounting thermally conducting mounting flange;

(ii) an isomorphic, thermally conductive material disposed on the flange;

(iii) a circuit comprising a semiconductor chip having a transistor arranged as the amplifier, such amplifier being adapted to operate at a nominal microwave frequency with a bank of frequencies, disposed on a portion of a surface of the isomorphic, thermally conductive material, other surface portions of the thermally conductive material extending laterally beyond the portion of the material having the semiconductor chip disposed thereon; and (iv) a corral having an aperture through an inner region thereof, the isothermal material being disposed within the aperture, such corral having an outer region thereon mounted to surface portions of the flange; and (B) biasing the amplifier for Class C operation; and (C) including feeding pulsed microwave signals to the amplifier for amplification thereby.

5. The method recited in claim 4 wherein the pulses have pulse widths greater than 750 microseconds.

6. The method recited in claim 5 wherein the pulses have a duty cycle of about 25 percent or more.

* * * * *

UNITED STATES PATENT AND TRADEMARK OFFICE
CERTIFICATE OF CORRECTION

PATENT NO.   : 6,281,574 B1
DATED        : August 28, 2001
INVENTOR(S)  : Drake et al.

It is certified that error appears in the above-identified patent and that said Letters Patent is hereby corrected as shown below:

Column 1,
Line 24, delete "coral" and replace with -- corral --.
Line 38, delete "semiconductor chip 12" and replace with -- semiconductor chip 10 --.
Line 55, delete "a mounting" and replace with -- a --.

Figure 4:
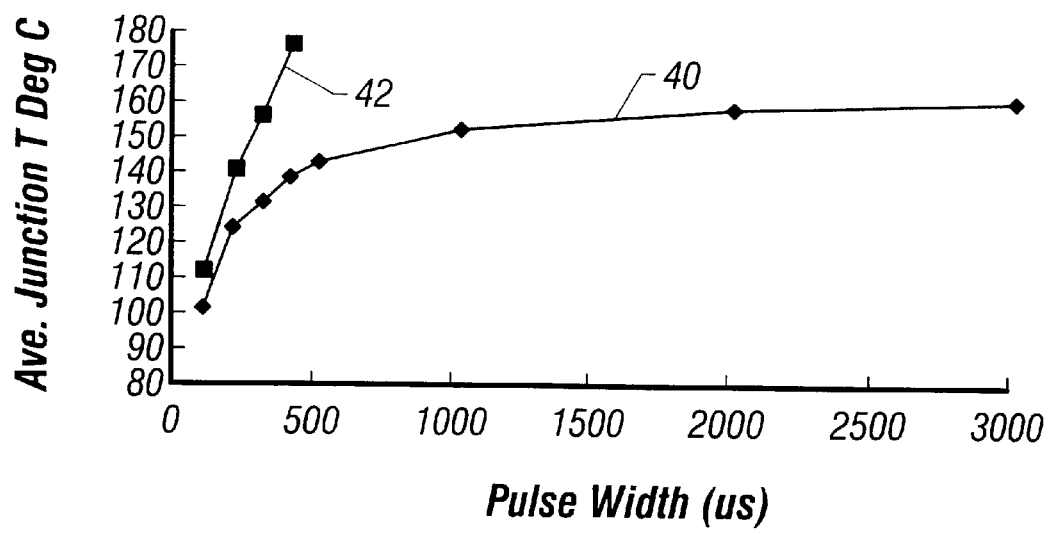
' FIG. 4 shows two curves, one showing the average of the peak junction temperature of a transistor cell in chip in the package of FIG. 1 as a function of pulse width for a 25% duty cycle 100 watt power dissipation, Vcc supply voltage of 32 volts dc in Class C operation and the other showing the average of the peak junction temperatures of several transistor cells in such as a function of pulse width for a 25% duty cycle 100 watt power dissipation, Vcc supply voltage of 32 volts dc in Class C operation for such an arrangement shown in FIGS. 1A and 1B.

Column 3,
Line 1, delete "FIGS. 1A" and replace with -- FIG. 1A --.
Line 9, delete "invention' FIG. 4" and replace with -- invention; FIG. 4 --.
Line 11, delete "in chip in" and replace with -- in the chip included in --.
Line 15, delete "in such as a" and replace with -- as a --.
Line 36, delete ".10" and replace with -- 10 --.
Line 57, delete "as an common" and replace with -- as a common --.
Line 60, delete "30 is here" and replace with -- 30 here is a --.

Column 4,
Line 11, delete "FIG. 3, packaged" and replace with -- FIG. 3 is packaged --.

Signed and Sealed this

Second Day of July, 2002

Attest:

JAMES E. ROGAN
Attesting Officer   Director of the United States Patent and Trademark Office